United States Patent
Eberler et al.

(10) Patent No.: US 10,162,024 B2
(45) Date of Patent: Dec. 25, 2018

(54) MR DEVICE WITH DISTRIBUTION NETWORK

(71) Applicants: Ludwig Eberler, Neumarkt i.d.OPf (DE); Jürgen Nistler, Erlangen (DE)

(72) Inventors: Ludwig Eberler, Neumarkt i.d.OPf (DE); Jürgen Nistler, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 408 days.

(21) Appl. No.: 15/019,567

(22) Filed: Feb. 9, 2016

(65) Prior Publication Data

US 2016/0238678 A1 Aug. 18, 2016

(30) Foreign Application Priority Data

Feb. 17, 2015 (DE) .................. 10 2015 202 861

(51) Int. Cl.
  *G01R 33/34* (2006.01)
  *G01R 33/36* (2006.01)
  *G01R 33/565* (2006.01)

(52) U.S. Cl.
  CPC ..... *G01R 33/34076* (2013.01); *G01R 33/3607* (2013.01); *G01R 33/3678* (2013.01); *G01R 33/5659* (2013.01)

(58) Field of Classification Search
  CPC .......... G01R 33/34076; G01R 33/3607; G01R 33/3678; G01R 33/5659
  See application file for complete search history.

(56) References Cited

U.S. PATENT DOCUMENTS

| 2002/0080068 | A1 | 6/2002 | Kim et al. |
| 2007/0279058 | A1 | 12/2007 | Bulkes et al. |
| 2007/0279061 | A1* | 12/2007 | Erickson ............ G01R 33/345 324/322 |

(Continued)

FOREIGN PATENT DOCUMENTS

| DE | 102010042633 A1 | 4/2012 |
| JP | 2002232225 A | 8/2002 |
| KR | 101142524 B1 | 5/2012 |

OTHER PUBLICATIONS

German Office Action for related German Application No. 10 2015 202 861.5, dated Jan. 21, 2016 with English Translation.

(Continued)

*Primary Examiner* — Rodney Bonnette
(74) *Attorney, Agent, or Firm* — Lempia Summerfield Katz LLC

(57) ABSTRACT

An MR device has at least one distribution network for distributing an electrical input signal (to a number of feeding points of an MR antenna. The distribution network has at least one first signal output and one second signal output connected to a node, a first phase-shifting element disposed between the node and the first signal output, and a second phase-shifting element disposed between the node and the second signal output. The first phase-shifting element and the second phase-shifting element create a different phase shift, and the first phase-shifting element and the second phase-shifting element are embodied as electrical lines of different length. The distribution network is applicable, for example, to feeding signals to a body coil of the MR device, especially a so-called birdcage antenna.

18 Claims, 3 Drawing Sheets

(56) References Cited

U.S. PATENT DOCUMENTS

| | | | | |
|---|---|---|---|---|
| 2008/0272787 A1* | 11/2008 | Boskamp | ........... | G01R 33/3415 |
| | | | | 324/322 |
| 2009/0189609 A1* | 7/2009 | Eberler | ............ | G01R 33/34076 |
| | | | | 324/322 |
| 2009/0192382 A1* | 7/2009 | Nistler | ............. | G01R 33/34046 |
| | | | | 600/410 |
| 2012/0098540 A1 | 4/2012 | Biber et al. | | |

OTHER PUBLICATIONS

Korean Office Action for Korean Application No. 10-2016-0018683, dated Jun. 19, 2017, with English Translation.

\* cited by examiner

MR DEVICE WITH DISTRIBUTION NETWORK

RELATED CASE

This application claims the benefit of DE 102015202861.5, filed on Feb. 17, 2015, which is hereby incorporated by reference in its entirety.

BACKGROUND

The embodiments relate to a magnetic resonance (MR) device with at least one distribution network for distributing an electrical input signal to a number of feeding points of an MR antenna. The embodiments are applicable, for example, to the feeding of a body coil of an MR device, especially a so-called birdcage antenna.

For MR imaging, at least one so-called B1 field is created by an MR transmit antenna at the location of a body, especially a patient, to be examined. In this case the MR antenna frequently has a number of antenna subsystems, which are able to be activated separately, in order to create a vertical or a horizontal field component for example, that together bring about a circular polarization of the B1 field.

At higher basic field strengths B0, as from approximately two Tesla, influencing of the MR transmit antenna by the patient can result in disturbances in the creation of the B1 fields. The influencing acts through a different loading of the antenna subsystems for example, through which the vertical and horizontal field components are attenuated differently. The influencing can also act on an antenna impedance, for example, because of a complex reflection factor and/or a coupling. Both lead to the fields ultimately created not corresponding to the desired field, for example in relation to an ideal circular-polarized excitation. In addition, there are also direct interactions between the patient and the electromagnetic fields created by the antenna. In the final analysis, both interactions lead to inhomogeneities occurring in the transmit and receive profiles. The inhomogeneities lead in part to marked variations in intensity in the MR images established therefrom.

One approach to solving these problems is to use multi-channel MR transmit systems. In such systems, the MR transmit antenna has N independent antenna elements that are activated by N independent RF transmitters. The activation can be set by suitable prescan methods so that at least one homogeneous field distribution is achieved during the excitation of the spins.

The simplest form of embodiment of a multi-channel MR transmit system used in practice is a two-channel transmit system in which the MR transmit antenna is able to be activated at two feeding points offset by an angle of 90° to each other by RF transmit pulses able to be created independently. However, the two-channel MR transmit system possesses too few degrees of freedom to be able to satisfactorily resolve the problems outlined above. There are MR transmit systems with more than two transmit channels, primarily for even higher basic field strengths B0 as from approximately seven Tesla, but, because of their complexity and costs, these are not yet being used in clinical systems.

A simple variant for exerting an influence on the homogeneity of the field components is the use of a transmit antenna with a four-port feed, as is shown in FIG. 1. As a rule, this involves a circular-polarized MR antenna (e.g. a so-called birdcage antenna BC), in which in each case two feeding points F1-A and F1-B or F2-A and F2-B lying 180° opposite to one another are connected to a common feed cable (and thus belong to the same channel), wherein a phase offset of 180° exists between the fed-in signals of a channel.

To this end, FIG. 2 shows a schematic layout of an MR device MRT with an MR transmit antenna in the form of a birdcage antenna BC with the feeding points F1-A, F1-B, F2-A and F2-B. The birdcage antenna BC has two distribution networks N1 and N2 or is connected to such networks. The distribution networks N1 and N2 are configured to divide up incoming input signals Tx-Ch1 and Tx-Ch2 of the two channels Ch1 or Ch2 (e.g. excitation pulses created by an RF transmitter) into part signals Tx-Ch1-A and Tx-Ch1-B or Tx-Ch2-A and Tx-Ch2-B in each case and to distribute the divided part signals to the feeding points F1-A and F1-B or F2-A and F2-B. Corresponding signal inputs I1 and I2 of the distribution networks N1 or N2 can be connected to respective transmitters (not shown in the figure), which in particular can create the input signals Tx-Ch1 or Tx-Ch2 independently.

Expressed more precisely, an input signal Tx-Ch1 or Tx-Ch2 fed into a signal input I1 or I2 can be divided up by the respective distribution network N1 or N2 into the respective two part signals Tx-Ch1-A and Tx-Ch1-B or Tx-Ch2-A and Tx-Ch2-B, which are then present at corresponding signal outputs O1-A and O1-B or O2-A and O2-B of the two distribution networks N1 or N2. The two part signals Tx-Ch1-A and Tx-Ch1-B or Tx-Ch2-A and Tx-Ch2-B of a respective input signal Tx-Ch1 or Tx-Ch2 or channel Ch1 or Ch2 are phase-shifted at the signal outputs O1-A and O1-B or O2-A and O2-B as well as at the feeding points F1-A and F1-B or F2-A and F2-B by phase offset $\Delta\varphi=180°$.

For even distribution of the power of an MR transmitter to the assigned feeding points F1-A and F1-B or F2-A and F2-B, true power dividers (e.g. Wilkinson dividers, hybrids etc.) can be used together with phase shifters. To this end, FIG. 3 shows an equivalent circuit diagram of a conventional distribution network Nx with x=1 or 2. The distribution network Nx has four nodes K1 to K4, wherein an inductance or coil L is connected in each case between the nodes K1 and K2 and also K3 and K4, while a capacitance or capacitor C is connected in each case between the nodes K1 and K3 or K2 and K4. The first node K1 is connected to the signal input Ix, the second node K2 via a first discrete phase-shifting component PS-A to the first signal output Ox-A, the third node K3 via a second discrete phase-shifting component PS-B to the second signal output Ox-B, and the fourth node K4 to ground GND. The first phase-shifting element PS-A shifts an electrical signal coming from the second node K2 by 90° or Lambda/4. The second phase-shifting element PS-B shifts an electrical signal coming from the third node K3 by −90° or by 270° or −Lambda/4 or 3/4 Lambda. The signals present at the first signal output Ox-A and at the second signal output Ox-B are thus phase-shifted in relation to one another by 180°, but especially have the same amplitude or power. The disadvantage here is the high demand for discrete components such as coils, capacitors, resistors etc. together with the necessary balancing of them.

SUMMARY AND DETAILED DESCRIPTION

The scope of the present invention is defined solely by the appended claims and is not affected to any degree by the statements within this summary.

The object is to overcome the disadvantages of the prior art at least partly and especially to provide an option, especially simple and low-cost, for homogenizing, for example symmetrizing, a field distribution in an MR transmit antenna, and thereby to obtain an improvement of the image quality, especially for MR devices with high basic field strengths of two Tesla or more, specifically with basic field strengths of seven Tesla or more.

The object is achieved by an MR device with at least one network (referred to below, without restricting its general applicability, as a "distribution network") for distribution of an electric input signal to a number of feeding points of an MR antenna. The distribution network has at least one first signal output and one second signal output. The first and second signal outputs are connected to a node, a first phase-shifting element disposed between the node and the first signal output, and a second phase-shifting element disposed between the node and the second signal output. The first phase-shifting element and the second phase-shifting element create a different phase shift $\Delta\varphi$, and the first phase-shifting element and the second phase-shifting element are embodied as electrical lines of different length.

This MR device provides the advantage that, by dispensing with discrete electrical or electronic components as phase-shifting elements, a homogenization of the field distribution in the MR antenna and thereby an improvement of the image quality can be achieved with simple circuit measures. In order to realize a power-dividing and phase-shifting network, a suitable interconnection of electrical lines is sufficient here. In other words, discrete components can be dispensed with in the networks and a power division and also a phase shifting can be realized just on the basis of lines or line parts (e.g., by cable parts). The cables can be selected in relation to their length and if necessary their line impedance so that the desired transmission characteristics are produced. In such cases, use is made of the fact that a value of a phase shift $\Delta\varphi$ during the passage of a signal through a line is able to be reproduced, shifted in phase, precisely and well by setting the length of the line.

The network can also be referred to as the "feeding network".

The MR antenna can be a pure transmit antenna or a transmit/receive antenna.

The lines of different length serving as phase-shifting elements can be embodied as cables or cable parts, such as as coaxial cables or parts thereof. As an alternative or in addition, the electrical lines can be embodied as conductor tracks or conductor track sections of a circuit board, as microstrip lines etc. Such electrical lines serving as phase-shifting elements especially do not include any conventional electrical components, such as resistors, capacitors, inductors, memristors etc. for example.

Basically more than two signal outputs can also be present.

One embodiment is that the node is directly connected to a signal input of the distribution network (i.e., especially without intermediate connection of a further dedicated phase-shifting element, especially also not in the form of a corresponding explicitly dimensioned electrical line). This gives the advantage that the at least two signal paths or signal branches connected to one another by the node can be embodied differently from one another in an especially simple manner.

Another embodiment is that the node is connected via a further phase-shifting element (referred to below, without restricting its general applicability, as the "third" phase-shifting element) to a signal input of the distribution network. In this way, the number of electrical lines serving as phase-shifting elements can be further reduced. Also the third phase-shifting element can be present in the form of an electrical line, the length of which is set in accordance with the size of the desired phase shift $\Delta\varphi$. Here too, the electrical line can be an appropriately configured cable part, a conductor track, or a conductor track section, a microstrip line etc. of the desired length.

Another embodiment is that the third phase-shifting element creates a phase shift in opposition to the first phase-shifting element or to the second phase-shifting element. In this way, a phase shift $\Delta\varphi$ at the first signal output or the second signal output can be set to 0 or a corresponding value, such as 360°, 720° etc.

Yet a further embodiment is that at least one further phase-shifting element is disposed in series with the first phase-shifting element or with the second phase-shifting element between the node and the first signal output and/or between the node and the second signal output in each case. This enables the phase shifting at the first signal output and/or at the second signal output to be set especially easily in an especially versatile way. An especially advantageous development for a simple structure is for the further phase-shifting element to be present in the form of an electrical line of a suitable, predetermined length.

It is also an embodiment that at least one further phase-shifting element creates a phase shift $\Delta\varphi$ in opposition to the first phase-shifting element or second phase-shifting element connected in series thereto. This also enables a phase shift $\Delta\varphi$ at the first signal output or the second signal output to be set to 0 or to a corresponding value modulo) (360°, e.g. 360°, 720° etc., especially if the node is connected directly to the signal input.

A further embodiment is that the first phase-shifting element and the second phase-shifting element create or cause an opposing phase shift $\Delta\varphi$ to one another.

The phase is especially shifted by the same amount $|\Delta\varphi|$. Thus, for example, the first phase-shifting element can create a phase shift of $+\Delta\varphi$ and the second phase-shifting element can create a phase shift of $-\Delta\varphi$. This might be especially advantageous if a further phase-shifting element connected between the node and the signal input creates a phase shift of the same absolute size (e.g., of $+\Delta\varphi$ or $-\Delta\varphi$), since then a phase shift of 0 is able to be set at one of the two signal outputs in a simple manner, while the other signal output then has a phase shift of $2\cdot\Delta\varphi$.

It is additionally an embodiment that a phase shift differing by 180° in relation to the second signal output is created by the distribution network at the first signal output. This allows the output signals produced at the signal outputs to be fed directly into the feeding points of an MR antenna, in order to make four-port feeding possible for example. To this end, it is especially advantageous if electrical lines running from the signal outputs to the feeding points have the same length.

In another embodiment, the first phase-shifting element or the second phase-shifting element causes a phase shift $\Delta\varphi$ corresponding to 0°. In one case, this enables the first phase-shifting element or the second phase-shifting element to be dispensed with entirely, so that then, for example, the signal input is connected directly to the associated first or second signal output or this signal output is also usable as a signal input.

The phase-shifting elements embodied as electrical lines of predetermined length are especially dimensioned so that desired transmission characteristics are obtained with the distribution network, for example specific impedances and/or voltages are obtained at the signal input and the signal outputs. The electrical lines, especially cables, are selected, for example, in relation to their length and line characteristic wave impedance so that the desired transmission characteristics are produced. In such case, two configurations are especially advantageous.

In a first configuration, the distribution network is embodied so that an input impedance at the signal input of the distribution network corresponds to a load impedance. The input impedance especially corresponds to the impedance present or measured at the signal input of the distribution network connected to the MR antenna, while the load impedance corresponds to an impedance present at a signal output of a downstream electrical structure, which especially includes the MR antenna or a part thereof. Thus, in particular, the same (input) impedance might appear at the signal input of the network as at the MR antenna. This embodiment gives the advantage that, unlike an otherwise usually parallel circuit, no impedance transformation by the distribution network takes place. This means that the impedance and thus the load imposed on the MR antenna by the patient can be deduced directly from the input impedance.

In a second configuration, the distribution network is embodied so that an amount of an input voltage at the signal input of the distribution network corresponds to an amount of an output voltage at a signal output of the distribution network. Thus, the same amount of voltage as at the input of the MR antenna especially appears at the signal input of the distribution network, and this is independent of the impedance or the loading of the MR antenna by the patient. This is especially advantageous if the load imposed on components of the MR antenna is to be determined and monitored (e.g., in order to prevent damage to components). It is then sufficient to measure the voltage at the signal input of the network in order to know the associated voltage in the MR antenna.

The characteristics, features and advantages of this invention described above, as well as the manner in which they are achieved, will be explained in greater detail in conjunction with the schematic description of exemplary embodiments given below. In these descriptions, for the sake of clarity, the same elements or elements with the same effect are provided with the same reference characters.

DETAILED DESCRIPTION

Figure 1:
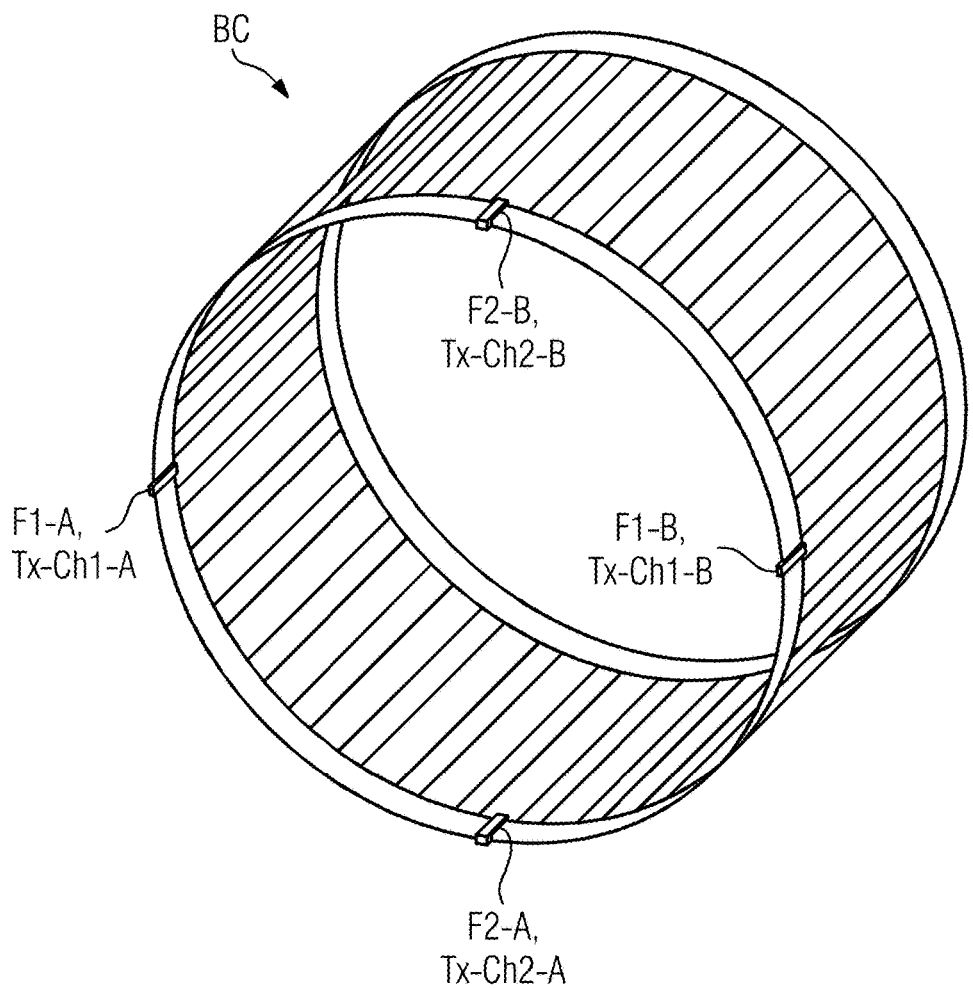
FIG. 1 shows an oblique view of an MR transmit antenna in the form of a birdcage antenna.
Figure 2:
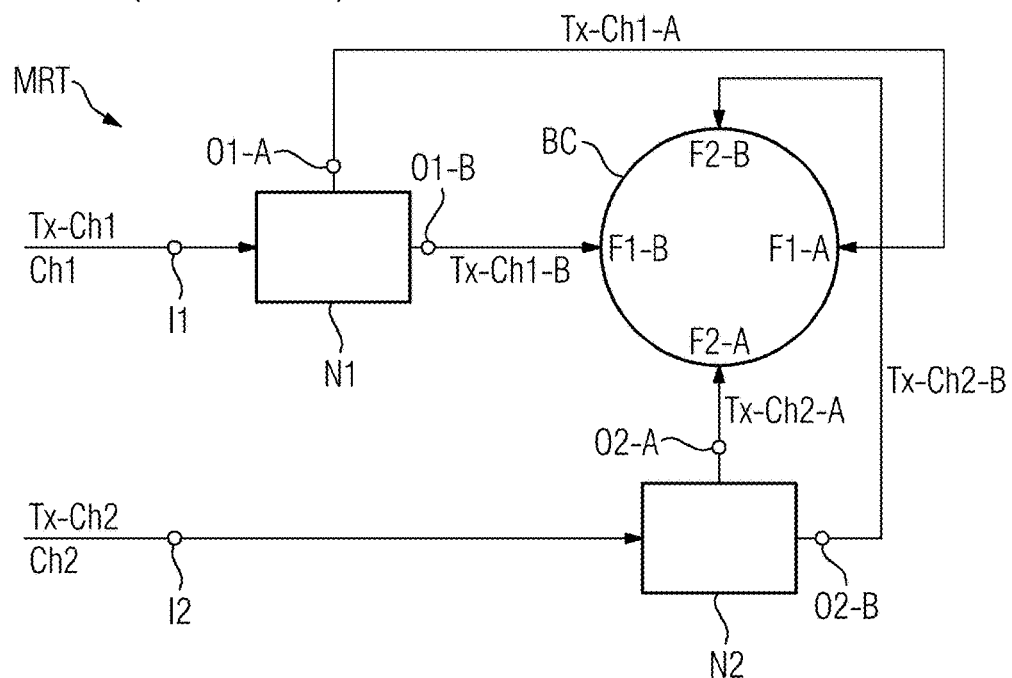
FIG. 2 shows a schematic layout of an MR device with an MR transmit antenna.
Figure 3:
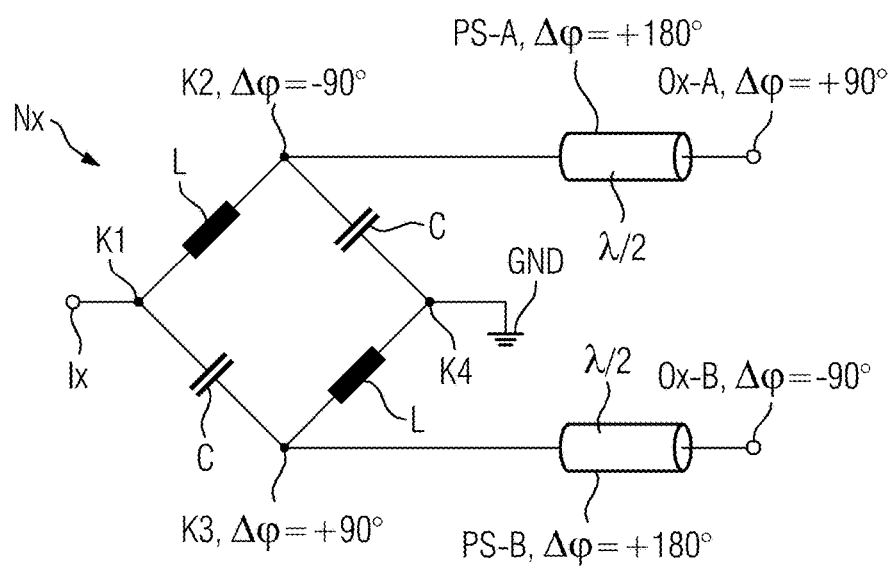
FIG. 3 shows an equivalent circuit diagram of a conventional distribution network of the MR device of FIG. 2.
Figure 4:
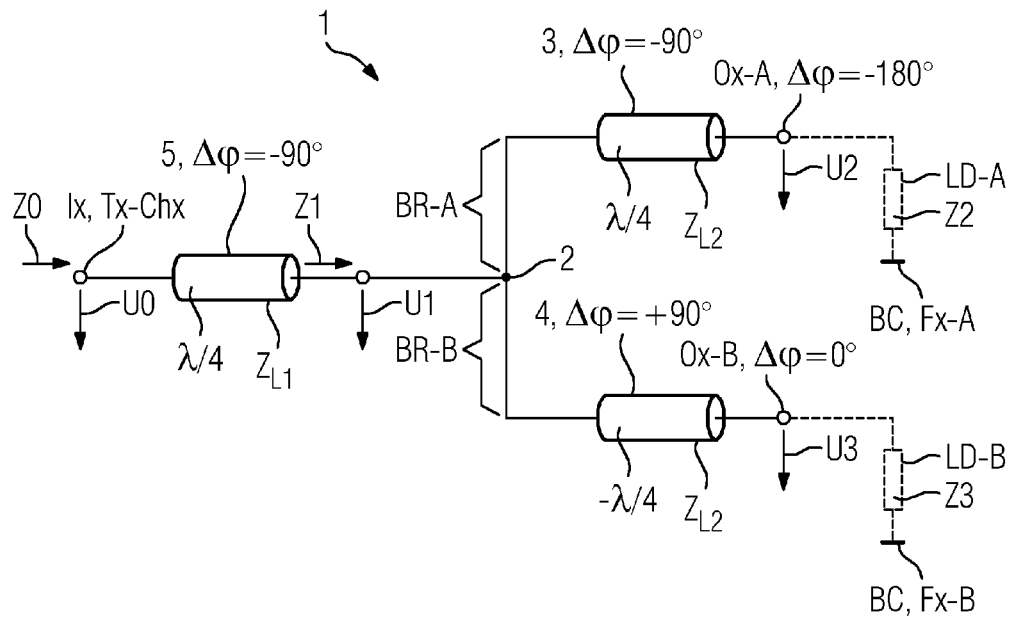
FIG. 4 shows an equivalent circuit diagram of a distribution network according to a first exemplary embodiment.

FIG. 4 shows an equivalent circuit diagram of an embodiment of a distribution network 1, which can be used for example as the distribution network Nx (x=1 or 2) or as the distribution networks N1 and N2 of the MR device MRT.

The distribution network 1 serves as a distribution network for distributing an input signal Tx-Chx (with Chx=Ch1 or Ch2) to a number of feeding points at an MR antenna Fx-A and Fx-B (with x=1 or 2). The distribution network 1 has a first signal output Ox-A and a second signal output Ox-B (with x=1 or 2). The first and second signal outputs are connected to a node 2. A first phase-shifting element in the form of a first line part 3 is disposed or connected between the node 2 and the first signal output Ox-A. A second phase-shifting element in the form of a second line part 4 is disposed between the node 2 and the second signal output Ox-B. The first line part 3 and the second line part 4 can be embodied as cables or cable parts for example, e.g. as coaxial cables.

At the node 2, the input signal Tx-Chx is divided or split into two portions of the same strength or power and also of the same phase as well, so that a branch is made at the node into two branches BR-A and BR-B, which here only feature the first line part 3 or the second line part 4.

The first line part 3 and the second line part 4 each create one phase shift $\Delta\varphi$, which can be set by the length of the line parts 3 and 4. The line parts 3 and 4 in such cases create different phase shifts $\Delta\varphi$, which are expressed by a different length of the line parts 3 and 4. The length of the first line part 3 is selected so that the portion of the input signal Tx-Chx entering at that point has a phase shift of $\Delta\varphi=-90°$ according to a phase delay by Lambda/4. The length of the second line part 4 is selected by contrast so that the portion of the input signal Tx-Chx entering there undergoes a phase shift of $\Delta\varphi=-90°$, corresponding to a phase delay by −Lambda/4 or 3/4 Lambda. The first line part 3 and the second line part 4 thus create or cause an opposing phase shift by the same amount in relation to one another.

The line parts 3 and 4 can be embodied identically except for their different length. As an alternative, the line parts 3 and 4 can be embodied differently in other ways, for example in relation to their line cross section, for example to be able to set a respective impedance $Z_{L2}$ more easily. In particular, the two line parts 3 and 4, by way of example, have the same impedance $Z_{L2}$ or characteristic wave impedance.

The node 2 is connected here via a third phase-shifting element in the form of a "third" line part 5 to a signal input Ix (i=1 or 2) of the distribution network 1. The third line part 5 causes a phase shift $\Delta\varphi=-90°$ of the not yet divided input signal Tx-Chx. The distribution network 1 thus has just one line part of length Lambda/4 (modulo (360°)) and "−Lambda/4" or 3/4 Lambda (modulo (360°)).

This produces, at the first signal output Ox-A of the first branch BR-A, a power-divided output signal Tx-Chx-A (with x=1 or 2) for excitation of the feeding point Fx-A, which is phase-shifted by comparison with the input signal Tx-Chx at the signal input Ix by $\Delta\varphi=-90°+(-90°)=-180°$. For evenly or periodically created input signals Tx-Chx, this can especially correspond to a phase shift $\Delta\varphi=+180°$.

On the other hand, a power-distributed output signal Tx-Chx-B is present at the second signal output Ox-B of the second branch BR-B, which is phase-shifted by comparison with the input signal Tx-Chx at the signal input Ix by $\Delta\varphi=-90°+90°=0°$. The phase-shift is because the third line part 5 creates an opposing phase shift to the second line part 4. The two output signals Tx-Chx-A and Tx-Chx-B are consequently phase-shifted in relation to one another by an amount of 180°.

The transformation characteristics of the distribution network 1 can additionally be set by a suitable choice of the characteristic wave impedance or the impedance $Z_{L1}$ of the third line part 5 and the impedances $Z_{L2}$ of the line parts 3 or 4. The setting can especially be made for adaptation to (e.g., complex-value) load impedances Z2 or Z3 of the MR antenna BC at the respective feeding point Fx-A or Fx-B. In this case, it is assumed by way of example that Z2 is at least approximately equal to Z3.

An impedance Z0 at the signal input Ix corresponds to the impedance or the characteristic wave impedance of the following arrangement (i.e., the power divider 1 and the load impedances Z2 and Z3 of the MR antenna BC). The impedance Z0 can thus especially correspond to the impedance, as seen from an RF power transmitter connected to the signal input Ix.

Two configurations of especial practical interest can be created in particular with the distribution network 1.

In a first configuration, the input impedance Z0 at the signal input Ix corresponds to the load impedance Z2 or Z3 (i.e., Z0=Z2=Z3 applies). This configuration can be set for example by $Z_{L1}=Z_{L2}/SQRT(2)$ being selected (e.g., $Z_{L1}=50$ Ohm and $Z_{L2}=71$ Ohm). Thus, the output voltage U2 or U3 present at the signal outputs Ox-A and Ox-B corresponds to the value U0/SQRT(2) with U0 being the input voltage present at the signal input Ix.

The advantage of this configuration is that no impedance transformation takes place. Thus, the impedance Z2 or Z3 and thereby the load imposed on the MR antenna BC by a patient can be deduced directly from the input impedance Z0.

In a second configuration, the amount of the input voltage U0 at the signal input Ix corresponds to the amount of the output voltages U2 or U3 (e.g., U0=−U2=−U3 applies). This configuration can be set for example by $Z_{L1}=Z_{L2}/2$ being selected (e.g., $Z_{L1}=50$ Ohm and $Z_{L2}=100$ Ohm). Thus, the input impedance Z0 is also set to half the load impedance Z2 or Z3 (i.e., Z0=Z2/2=Z3/2 then applies).

Thus, especially the same amount of voltage as at the respective signal output Ox-A or Ox-B of the distribution network 1 or as at an input of the MR antenna BC appears at the signal input Ix, and does so independently of the impedance or loading of the MR antenna BC by the patient. This is especially advantageous when a component loading of the MR antenna is to be determined or monitored (e.g. to prevent damage to components). It is then sufficient to measure the voltage U0 at the signal input Ix of the distribution network 1 in order then to know the associated voltage U2 or U3 in the MR antenna BC.

Figure 5:
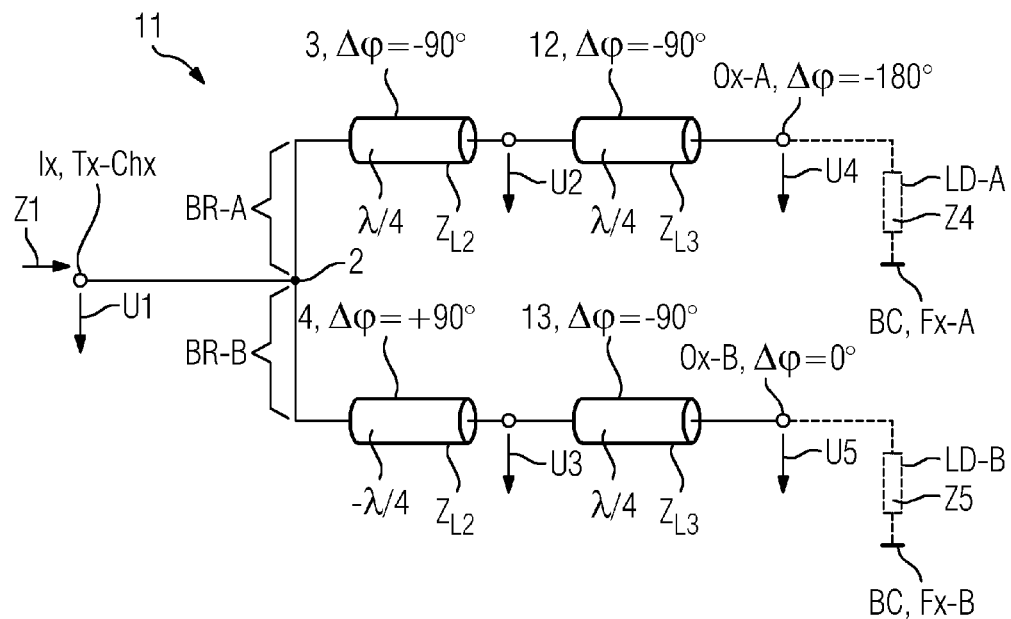
FIG. 5 shows an equivalent circuit diagram of a distribution network according to a second exemplary embodiment.

FIG. 5 shows an equivalent circuit diagram of another embodiment of a distribution network 11, which can likewise be used as the distribution network Nx (x=1 or 2) or as the distribution networks N1 and N2 of the MR device MRT.

The distribution network 11, like the distribution network 1, has the node 2, the first line part 3 and the second line part 4. However the node 2 is now connected directly to the signal input Ix of the distribution network 11. The signal input Ix has an input impedance Z1, which is defined in a similar manner to the input impedance Z0 of the distribution network 1.

In addition to the distribution network 1, a further phase-shifting element in the form of a first further line part 12 is connected in series with the first line part 3 between the node 2 and the first signal output Ox-A. Also yet another phase-shifting element in the form of a second further line part 13 is now connected in series with the second line part 4 between the node 2 and the second signal output Ox-B.

The two further line parts 12 and 13 create a phase shift Δφ of the electrical signal passing through them of −90° and are thus Lambda/4 phase delayers. Purely by way of example, the further line parts 12 and 13 have an impedance $Z_{L3}$ here. Through this, at each of the two signal outputs Ox-A and Ox-B of the branches BR-A or BR-B, a phase shift Δφ of −180° or 0° is achieved, in a similar manner to the branches BR-A or BR-B of the distribution network 1. For example in branch BR-B, similar to branch BR-B of distribution network 1, an opposing phase shift to one another of +90° or −90° is created by the second line part 4 and by the second further line part 13. The impedances Z4 and Z5 shown here represent the (e.g., complex-value) load impedances of the MR antenna BC at the associated feeding points Fx-A or Fx-B. Z4 is approximately equal to Z5. Z4 and Z5 can correspond to the load impedances Z2 and Z3 of the distribution network 1.

With distribution network 11, two configurations of especial practical interest can be created.

In a first configuration of distribution network 11, the input impedance Z1 at the signal input Ix corresponds to the load impedance Z4 or Z5 (i.e., Z1=Z4=Z5 applies). This configuration can be set for example by $Z_{L2}=Z_{L3}*SQRT(2)$ being selected (e.g., $Z_{L2}=71$ Ohm and $Z_{L3}=50$ Ohm). Thus, the output voltage U4 or U5 present at the signal outputs Ox-A and Ox-B corresponds to the value −U1/SQRT(2), with U0 being the input voltage present at the signal input Ix.

This configuration has the advantage that no impedance transformation takes place. The load impedance Z4 and thus the load of the MR antenna BC by a patient can thus be directly deduced from the input impedance Z1.

In a second configuration of the distribution network 11, the amount of the input voltage U1 at the signal input Ix corresponds to the amount of the output voltages U4 or U5 (i.e., U1=U4=U5 applies). This configuration can be set for example by $Z_{L2}=Z_{L3}$ being selected (e.g., $Z_{L2}=Z_{L3}=50$ Ohm). Thus, the input impedance Z1 is set to half the load impedance Z4 or Z5 (i.e., Z1=Z4/2=Z5/2 then applies).

Although the invention has been illustrated and described in greater detail by the exemplary embodiments shown, the invention is not restricted thereto and other variations can be derived herefrom by the person skilled in the art, without departing from scope of protection of the invention.

Thus, more than two branches can branch off from the node (e.g., three, four etc. branches). The distribution network might thus divide the input signal into more than two output signals, of which at least two output signals are phase-shifted in relation to one another.

For example, a number of lines connected in series (e.g., the line parts 3 and 12 present separately or the line parts 4 and 13 of the distribution network 11) can be merged into a single line part with the same characteristics. In particular, the line parts present in a common branch can be merged into a single line part with the same characteristics. If the phase shifts of the line parts of a branch add up to zero, the signal output of this branch can also be connected directly to the node or the node can serve as a signal output for this branch.

In general "one" can be understood as one item or more than one item, especially in the sense of "at least one" or "one or more" etc., provided this is not explicitly excluded, e.g. by the expression "precisely one" etc.

Also, a numerical specification can include precisely the specified number and also a normal tolerance range, provided the tolerance is not explicitly excluded.

It is intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

The invention claimed is:

1. A magnetic resonance (MR) device comprising:
an MR antenna with a number of feeding points; and
at least one distribution network for distributing an electrical input signal to the number of the feeding points of the MR antenna, which distribution network has at least
one first signal output and one second signal output, which are connected to a node,
a first phase-shifting element disposed between the node and the first signal output, and
a second phase-shifting element disposed between the node and the second signal output,
wherein
the first phase-shifting element and the second phase-shifting element create a different phase shift; and
the first phase-shifting element and the second phase-shifting element comprise electrical lines of different length.

2. The MR device as claimed in claim 1, in which the node is connected directly to a signal input of the distribution network.

3. The MR device as claimed in claim 1, in which the node is connected via a third phase-shifting element in the form of an electrical line to a signal input of the distribution network.

4. The MR device as claimed in claim 3, in which the third phase-shifting element creates a phase shift in opposition to the first phase-shifting element or to the second phase-shifting element.

5. The MR device as claimed in claim 4, further comprising at least one further phase-shifting element in the form of an electrical line disposed in series with the first phase-shifting element or with the second phase-shifting element between the node and the first signal output and/or between the node and the second signal output.

6. The MR device as claimed in claim 5, further comprising at least one further phase-shifting element configured to create the phase shift in opposition to the first phase-shifting element or second phase-shifting element connected in series thereto.

7. The MR device as claimed in claim 6, wherein the first phase-shifting element and the second phase-shifting element create a phase shift in opposition to one another.

8. The MR device as claimed in claim 7, wherein the different phase shift differing by 180° in relation to the second signal output is created by the distribution network at the first signal output.

9. The MR device as claimed in claim 8, wherein an input impedance of the distribution network corresponds to a load impedance.

10. The MR device as claimed in claim 8, wherein an amount of an input voltage corresponds to an amount of an output voltage.

11. The MR device as claimed in claim 5, wherein the first phase-shifting element or the second phase-shifting element causes the different phase shift corresponding to 0°.

12. The MR device as claimed in claim 1, further comprising at least one further phase-shifting element in the form of an electrical line disposed in series with the first phase-shifting element or with the second phase-shifting element between the node and the first signal output and/or between the node and the second signal output.

13. The MR device as claimed in claim 1, further comprising at least one further phase-shifting element configured to create the phase shift in opposition to the first phase-shifting element or second phase-shifting element connected in series thereto.

14. The MR device as claimed in claim 1, wherein the first phase-shifting element and the second phase-shifting element create the phase shift in opposition to one another.

15. The MR device as claimed in claim 1, wherein the different phase shift differing by 180° in relation to the second signal output is created by the distribution network at the first signal output.

16. The MR device as claimed in claim 1, wherein the first phase-shifting element or the second phase-shifting element causes the different phase shift corresponding to 0°.

17. The MR device as claimed in claim 1, wherein an input impedance of the distribution network corresponds to a load impedance.

18. The MR device as claimed in claim 1, wherein an amount of an input voltage corresponds to an amount of an output voltage.

* * * * *